United States Patent
Bauer

(10) Patent No.: US 7,815,122 B2
(45) Date of Patent: Oct. 19, 2010

(54) METHOD FOR MAKING AN ELECTRONIC LABEL AND ELECTRONIC LABEL OBTAINED BY SAID METHOD

(75) Inventor: Pierre-Alain Bauer, Les Geneveys-Sur-Coffrane (CH)

(73) Assignee: Eric Bauer, Hergiswil (CH)

( * ) Notice: Subject to any disclaimer, the term of this patent is extended or adjusted under 35 U.S.C. 154(b) by 846 days.

(21) Appl. No.: 10/594,089

(22) PCT Filed: Mar. 25, 2004

(86) PCT No.: PCT/IB2004/000887

§ 371 (c)(1),
(2), (4) Date: Apr. 25, 2007

(87) PCT Pub. No.: WO2005/093645

PCT Pub. Date: Oct. 6, 2005

(65) Prior Publication Data

US 2007/0194130 A1 Aug. 23, 2007

(51) Int. Cl.
| | |
|---|---|
| *G06K 19/00* | (2006.01) |
| *G06K 19/06* | (2006.01) |
| *G08B 13/14* | (2006.01) |
| *H01R 43/00* | (2006.01) |
| *H01R 9/00* | (2006.01) |
| *H01R 43/02* | (2006.01) |
| *H05K 3/34* | (2006.01) |
| *H01K 3/00* | (2006.01) |
| *H01K 3/10* | (2006.01) |
| *H01L 21/00* | (2006.01) |
| *H01L 21/336* | (2006.01) |
| *H01L 21/331* | (2006.01) |
| *B23K 11/00* | (2006.01) |

(52) U.S. Cl. .............. 235/487; 235/492; 235/493; 340/572.1; 29/825; 29/839; 29/840; 29/849; 29/850; 29/843; 29/860; 438/22; 438/48; 219/117.1; 219/121.13; 228/180.5; 228/180.1

(58) Field of Classification Search ............... 228/170, 228/180.5; 219/117.1; 340/572.1; 235/487, 235/492, 493; 29/825, 839, 840, 849, 850, 29/402.07, 843, 860, 842, 844; 438/89, 118, 438/293, 470, 352, 22, 48
See application file for complete search history.

(56) References Cited

U.S. PATENT DOCUMENTS

| | | | |
|---|---|---|---|
| 4,053,096 A | * | 10/1977 | Heim .................. 228/4.5 |
| 4,110,838 A | | 8/1978 | Noe |
| 4,142,288 A | * | 3/1979 | Flammer et al. ............ 228/155 |

(Continued)

FOREIGN PATENT DOCUMENTS

DE 42 05 742 9/1992

(Continued)

*Primary Examiner*—Daniel Walsh
(74) *Attorney, Agent, or Firm*—Young & Thompson

(57) ABSTRACT

A method of making an electronic label including a chip (1) provided with two contact strips (2, 3) onto which a conducting wire (4) is welded in a single operation. The segment of conducting wire (4) forming the antenna is then cut between the two contact strips (2, 3) of chip (1). The group of chip and antenna thus realized may then be encapsulated between two sheets of a fibrous or plastic material.

19 Claims, 1 Drawing Sheet

U.S. PATENT DOCUMENTS

| | | | | |
|---|---|---|---|---|
| 5,515,606 A * | 5/1996 | Albeck et al. | ................. | 29/850 |
| 5,809,633 A * | 9/1998 | Mundigl et al. | ............... | 29/600 |
| 6,088,230 A * | 7/2000 | Finn et al. | .................. | 361/737 |
| 6,100,511 A * | 8/2000 | Kempe | ....................... | 219/679 |
| 6,100,804 A * | 8/2000 | Brady et al. | ............. | 340/572.7 |
| 6,665,931 B2 * | 12/2003 | Yamaguchi et al. | ............ | 29/850 |
| 6,698,089 B2 * | 3/2004 | Finn et al. | ..................... | 29/748 |
| 6,705,511 B1 * | 3/2004 | Dames et al. | ........... | 228/180.5 |
| 6,786,419 B2 * | 9/2004 | Kayanakis | .................. | 235/492 |
| 6,794,727 B2 * | 9/2004 | Leduc et al. | ................ | 257/531 |
| 6,908,786 B2 * | 6/2005 | Halope | ....................... | 438/106 |
| 7,151,495 B2 * | 12/2006 | Strache et al. | .............. | 343/713 |
| 7,243,840 B2 * | 7/2007 | Bason et al. | ................ | 235/492 |
| 7,312,528 B2 * | 12/2007 | Watanabe et al. | ........... | 257/728 |
| 7,581,308 B2 * | 9/2009 | Finn | ......................... | 29/600 |
| 7,610,675 B2 * | 11/2009 | Hansson et al. | ............... | 29/606 |
| 7,752,743 B2 * | 7/2010 | Lolli | ........................... | 29/748 |
| 2001/0006194 A1 * | 7/2001 | Kayanakis et al. | .......... | 235/492 |
| 2001/0054230 A1 * | 12/2001 | Finn et al. | ..................... | 29/748 |
| 2002/0055822 A1 * | 5/2002 | Amadeo et al. | ............... | 702/38 |
| 2002/0089049 A1 * | 7/2002 | Leduc et al. | ................ | 257/679 |
| 2002/0099473 A1 * | 7/2002 | Amadeo et al. | ............. | 700/251 |
| 2002/0179678 A1 * | 12/2002 | Araki | ......................... | 228/102 |
| 2003/0000998 A1 * | 1/2003 | Yamauchi | ............. | 228/180.21 |
| 2003/0052177 A1 * | 3/2003 | Halope | ....................... | 235/492 |
| 2003/0221766 A1 * | 12/2003 | Strache et al. | .............. | 156/123 |
| 2004/0200061 A1 * | 10/2004 | Coleman et al. | ............. | 29/825 |
| 2004/0211058 A1 * | 10/2004 | Hansson et al. | ............. | 29/825 |
| 2005/0284917 A1 * | 12/2005 | Clare et al. | ................. | 228/170 |
| 2006/0104041 A1 * | 5/2006 | Thevenot | .................... | 361/760 |
| 2006/0139901 A1 * | 6/2006 | Meireles et al. | ............. | 361/760 |
| 2007/0194130 A1 * | 8/2007 | Bauer | ........................ | 235/492 |
| 2007/0222613 A1 * | 9/2007 | Fidelis et al. | ............ | 340/572.8 |
| 2008/0150817 A1 * | 6/2008 | Carre et al. | ................. | 343/741 |
| 2008/0179404 A1 * | 7/2008 | Finn | ......................... | 235/492 |
| 2008/0283618 A1 * | 11/2008 | Pueschner et al. | ........... | 235/492 |
| 2009/0033585 A1 * | 2/2009 | Lang | ......................... | 343/906 |
| 2009/0038735 A1 * | 2/2009 | Kian | ........................ | 156/73.1 |
| 2009/0100667 A1 * | 4/2009 | O'Keeffe et al. | .............. | 29/600 |
| 2009/0102741 A1 * | 4/2009 | Li et al. | ...................... | 343/866 |

FOREIGN PATENT DOCUMENTS

| | | |
|---|---|---|
| EP | 0 913 268 | 5/1999 |
| EP | 1 471 544 | 10/2004 |

* cited by examiner

METHOD FOR MAKING AN ELECTRONIC LABEL AND ELECTRONIC LABEL OBTAINED BY SAID METHOD

Object of the present invention is a method of making an electronic label, as well as an electronic label obtained by realizing the method. Another object of the invention is a welding electrode allowing the method of making an electronic label according to the invention to be realized. The invention more particularly is concerned with the steps of a manufacturing process by which an electronic label can be produced that basically consists of a fibrous support such as paper and/or textile for instance, or of a plastic support, holding an electronic chip provided with two contact strips as well as an antenna consisting of a conducting wire.

Electronic labels are passive devices, or perhaps active devices, that can exchange data with an adequate reader also fitted with an antenna. With passive devices, data exchange between the reader and the electronic label occurs via electromagnetic coupling. When the label is close to the reader, the radiation field emitted by the reader's antenna allows the energy to be furnished that is required for the function of the electronic chip in the label.

Numerous applications are apt to use this technology, the management of a stock of articles provided with such labels, or the identification of objects bearing electronic labels being cited as nonlimiting examples. These electronic labels are marked out as an advantageous replacement of the bar codes or other ID markers on the most diverse objects, so as to optimise stock management that will then become automatic, or any other processing of the data supplied by these articles.

One of the particular difficulties encountered in the manufacture of such labels resides in fixing the antenna on the contact strips of the chip integrated into the label. This operation is in fact made difficult by the very small size of the chips used in such labels.

Known technologies for instance involve fixing the ends of the antenna with conductive glue on each of the two contact strips of the chip. Other technologies involve screen printing to integrate the antenna into a plastic sheet and then laminating this sheet onto the support of the label receiving the chip. These known technologies have certain disadvantages, of which for the use of conductive glues, one may cite the fact that the glue ought to be applied in a highly precise fashion to very small surface areas. For this reason one cannot avoid a flowing of the glue provoking short circuits making the label useless.

The laminating technologies in turn are difficult and costly in their realization.

It is the aim of the present invention to propose a method of making one or a number of electronic labels that is simple to realize, and allows electronic labels to be made more rapidly and more advantageously.

This aim is attained by a method of making that is distinguished by the characteristics cited in claims 1 and 3.

Another aim of the invention consists in offering a tool, and more particularly a welding electrode or welding head, that allows the method of making to be realized, and is distinguished by the characteristics cited in claim 7.

The aims, objects, and characteristics of the invention will become more apparent from a reading of the following description made while referring to the appended drawings in which.

Figure 1:
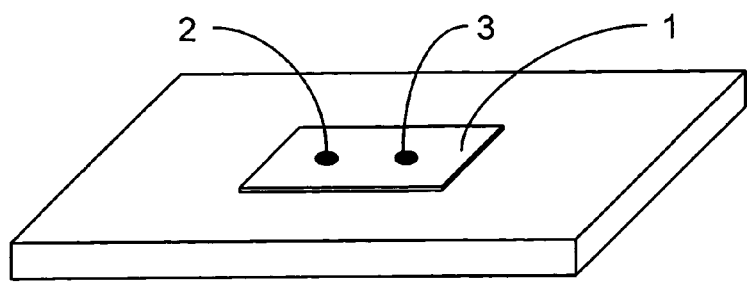
FIG. 1 illustrates an electronic chip used to realize a label according to the invention.

Reference is made to FIG. 1 schematically illustrating a chip 1 provided with two contact strips 2, 3. The contact strips (2, 3) consist of a raised point of gold or tin, for instance, generally called a 'gold bumper' or 'solder bumper' according to sanctioned Anglo-Saxon terminology. The chips 1 used to realize the electronic labels according to the invention can be passive UHF chips, that is, chips lacking a power source that are powered by electromagnetic coupling thanks to a reader (not shown) that is provided with an antenna. The voltage induced in the label's antenna will be rectified and serves to power the chip. The chips available commercially typically will work at a distance of about four meters, and can be processed at the rate of about 400 articles per second.

An example of passive chips that can be used to realize the electronic labels according to the invention are those distributed under reference number EM4222 of the Swiss company EM Microelectronic-Marin SA.

The dimensions of such chips are of the order of 700 microns by 900 microns, while the gap between the contact strips 2 and 3 is of the order of 400 microns. The diameter of the contact strips is of the order of 80 microns.

It is understood that the method of making that is object of the invention may immediately be applied to realizing electronic labels using other chips, such as active chips or high-frequency chips, for example, when a conductor serving as an antenna must be connected with the chip's contact strips.

In the following description, the manufacturing steps are described in terms of a manual manufacture of an electronic label. It is obvious that all these steps may be automated in part or in full, by known means beyond the scope of the present application, and which for this reason will not be described in detail.

In FIG. 1 a chip 1 adapted for realizing an electronic label laid out on a flat support piece is schematically represented. The bottom face of chip 1 that has no contact strips is in contact with the top face of the support piece.

An open dipole antenna must be connected to the contact strips 2, 3 of chip 1 in order to realize the electronic label. The antenna consists of a conducting wire 4, a copper wire for instance having a diameter between 50 and 100 microns.

Figure 2:
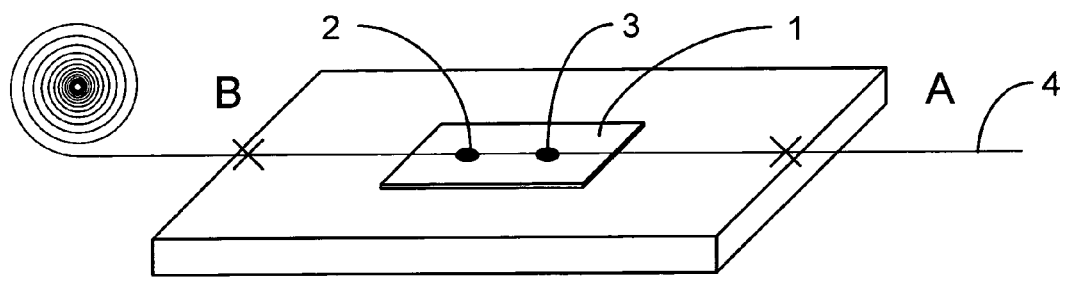
FIG. 2 shows the operation of pulling a conducting wire, to be connected to the chip.

In FIG. 2, a conducting wire 4 is taken from a reel and brought in front of the two contact strips 2, 3 of chip 1. The wire 4 is cut at its two ends A and B once it has attained the length desired for antenna formation.

Figure 3:
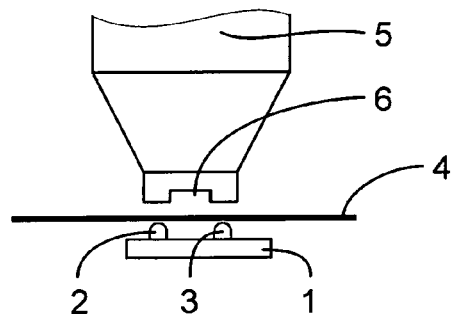
FIG. 3 illustrates more particularly the welding electrode prior to the welding operation that allows the method of the invention to be realized.

The next step of the method of making consists of welding the conducting wire 4 to the two contact strips 2, 3. This is realized with a welding electrode 5 having an active portion exhibiting an end provided with a recess 6 in its center. The width of recess 6 essentially corresponds to the distance between the two contact strips 2, 3, its depth to at least the height of the contact strips 2, 3. By way of example, such a welding electrode or welding head is schematically represented in FIG. 3 in its position just prior to the welding operation.

Figure 4:
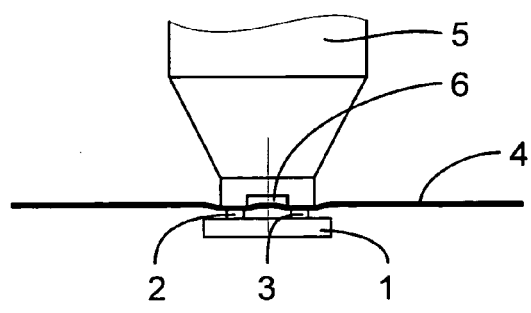
FIG. 4 illustrates the chip during the operation of welding of the conducting wire forming the antenna.

In FIG. 4 the welding head is pressed against the conducting wire. Under the effects of heat and pressure, the wire 4 is welded in a single operation to both contact strips 2, 3. The part of the conducting wire 4 between the two contact strips 2, 3 will deform under the effect of the heat. Moreover, the pressure exerted by the welding head 5 on wire 4 tends to accentuate this deformation, by adding to the material between the two contact strips 2, 3. Trials have shown that the conducting wire 4 undergoes a slight deformation forming a circular arc in the direction of recess 6 of the welding electrode.

The following step consists in cutting the conducting wire between the two connecting strips 2, 3 with the aid of an appropriate cutting tool, so as to eliminate the short circuit formed while welding the wire 4 onto the contact strips 2, 3.

To be noted that the welding operation, by virtue of the shape of electrode 5 comprising a recess 6, allows the wire 4 to be welded in a single operation to both contact strips 2, 3, which is an advantage with respect to operating speed. Actually, in other processes each end of the conducting wire is welded separately, which requires two distinct welding operations and attending loss of time. By virtue of the particular configuration of the welding head, and more particularly the recess 6 present in its center, one obtains a deformation of the conducting wire 4 after the welding operation that facilitates the cutting operation. Actually the segment of wire 4 between the contact strips 2, 3 exhibits the configuration of a circular arc facing outward, which diminishes the risk of damaging the chip during the operation of cutting the wire.

Figure 5:
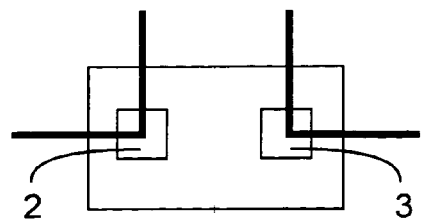
FIG. 5 illustrates in a schematic way a version of the manufacture of an electronic label according to the invention where two segments of conducting wire are used to realize the antenna.

In a variant of the process illustrated in part in FIG. 5, wire 4 is cut to the appropriate length in advance, and at least a portion of each of the two segments of wire 4 is brought in front of one of the two contact strips 2, 3. In this variant the welding operation is again unique, and allows the antenna to be formed in a single operation during which the two segments of the conducting wire 4 are welded to the strips 2, 3 with the aid of welding electrode 5.

The last step required to realize the electronic label consists of enveloping the assembly constituted by chip 1 provided with its antenna 4, between two layers of an appropriate material. To do this one may apply any known technology, cold or hot laminating of two sheets of a fibrous material (textile or paper) or of plastic, cold or hot gluing, or any other means to enclose chip 1 provided with its antenna 4 between two sheets of an ad hoc material.

In a variant, the electronic label merely consists of chip 1 provided with its antenna, to be directly integrated into diverse objects such as clothing for instance. In this case it is not necessary to enclose the chip with its antenna between two sheets of a fibrous material.

In another variant, the conducting wire 4 intended to form the antenna of the label is surrounded by a textile fiber sheathing. In this case a short length of wire must be stripped before being welded to the contact strips 2, 3 of chip 1.

The electronic labels obtained by this method are manufactured rapidly, partly by virtue of the unique welding operation. They also offer great reliability, inasmuch as the risk of short-circuiting of the two contact strips is reduced relative to other manufacturing technologies.

The invention claimed is:

1. Method of making an electronic label comprising an electronic chip (1) provided with two contact strips (2, 3) and an antenna formed from conducting wire (4), comprising:
    placing the chip (1) on a support piece so that the contact strips (2, 3) of said chip are situated on the side opposite to that in contact with the support piece;
    taking conducting wire (4) from a reel and placing it on the support such that at least one portion is positioned facing the two contact strips of the chip (1); and
    welding the conducting wire (4) in a single welding operation onto the two contact strips (2, 3) to form the antenna of the electronic label,
    wherein the welding of the conducting wire or wires (4) onto the contact strips (2, 3) is done with a welding electrode (5) having an active portion with an end, and at the end of its active portion a recess (6), such that the recess (6) has a width that essentially corresponds to the gap between the two contact strips (2, 3) enabling the welding electrode (5) to weld the antenna to the contact strip but not welding the wire in the gap between the contact strips.

2. Method of making an electronic label according to claim 1, further comprising cutting a portion of the conducting wire (4) forming the antenna situated between the two contact strips (2, 3) above chip (1).

3. Method of making an electronic label comprising an electronic chip (1) provided with two contact strips (2, 3) and an antenna formed of conducting wire (4) comprising:
    cutting the conducting wire (4) into two segments, at least one portion of each of the two segments of the conducting wire is positioned facing a contact strip (2, 3) of the chip (1);
    welding the two segment portions in a single welding operation onto the two contact strips (2, 3) of chip (1) to form the antenna of the electronic label,
    wherein the welding of the conducting wire or wires (4) onto the contact strips (2, 3) is done with a welding electrode (5) having an active portion with an end, and at the end of its active portion a recess (6), such that the recess (6) has a width that essentially corresponds to the gap between the two contact strips (2, 3) enabling the welding electrode (5) to weld the antenna to the contact strip but not welding the wire in the gap between the contact strips.

4. Method of making an electronic label according to claim 1, further comprising integrating the chip (1) provided with its antenna (4) between two sheets of a fibrous or plastic material.

5. Electronic label comprising a chip (1) and an antenna consisting of a conducting wire (4) welded onto the contact strips (2, 3) of chip (1), characterized in that it is made by the method of claim 1.

6. Method of making an electronic label according to claim 1, wherein the single welding operation simultaneously welds the conducting wire (4) to the two contact strips (2, 3) of the chip (1).

7. Method of making an electronic label according to claim 1, wherein the recess (6) of the welding electrode (5) has a depth essentially corresponding to a height of the two contact strips (2, 3) of the chip (1).

8. Method of making an electronic label according to claim 1, further comprising cutting a portion of the conducting wire (4) forming the antenna situated between the two contact strips (2, 3) into two segments before the step of welding.

9. Method of making an electronic label according to claim 8, wherein after the step of welding the two segments of the conducting wire (4) between the contact strips (2, 3) exhibit the configuration of a circular arc facing outward from the chip (1).

10. Electronic label comprising a chip (1) and an antenna consisting of a conducting wire (4) welded onto the contact strips (2, 3) of chip (1), characterized in that it is made by the method of claim 3.

11. Method of making an electronic label according to claim 3, further comprising integrating the chip (1) provided with its antenna (4) between two sheets of a fibrous or plastic material.

12. Welding electrode (5) for realizing the method of claim 3, wherein the recess (6) of the welding electrode (5) has a depth essentially corresponding to a height of the two contact strips (2, 3) of the chip (1).

13. Method of making an electronic label according to claim 3, wherein the single welding operation simultaneously welds the two segment portions to the two contact strips (2, 3) of the chip (1).

14. Method of making an electronic label according to claim 3, wherein after the step of welding the two segments of the conducting wire (4) between the contact strips (2, 3) exhibit the configuration of a circular arc facing outward from the chip (1).

15. Method of making an electronic label comprising an electronic chip (1) provided with two contact strips (2, 3) and an antenna formed from conducting wire (4), comprising:
 placing the chip (1) on a support piece so that the contact strips (2, 3) of said chip are situated on the side opposite to that in contact with the support piece;
 taking conducting wire (4) from a reel and placing it on the support such that at least one portion is positioned facing the two contact strips of the chip (1); and
 welding the conducting wire (4) in a single welding operation onto the two contact strips (2, 3) to form the antenna of the electronic label,
wherein the welding of the conducting wire or wires (4) onto the contact strips (2, 3) is done with a welding electrode (5) having an active portion with an end, and at the end of its active portion a recess (6), such that the recess (6) has dimensions that essentially correspond to the spaced between the two contact strips (2, 3) enabling electrode to weld the antenna to the contact strip but not welding the wire between the contact strips disposed in the recess (6).

16. Method of making an electronic label according to claim 15, wherein the single welding operation simultaneously welds the conducting wire (4) to the two contact strips (2, 3) of the chip (1).

17. Method of making an electronic label according to claim 15, wherein the recess (6) of the welding electrode (5) has a depth essentially corresponding to a height of the two contact strips (2, 3) of the chip (1).

18. Method of making an electronic label according to claim 15, further comprising cutting a portion of the conducting wire (4) forming the antenna situated between the two contact strips (2, 3) into two segments before the step of welding.

19. Method of making an electronic label according to claim 18, wherein after the step of welding the two segments of the conducting wire (4) between the contact strips (2, 3) exhibit the configuration of a circular arc facing outward from the chip (1).

* * * * *